United States Patent [19]

Yasuda et al.

[11] Patent Number: 5,587,607
[45] Date of Patent: Dec. 24, 1996

[54] SEMICONDUCTOR INTEGRATED CIRCUIT DEVICE HAVING IMPROVEMENT ARRANGEMENT OF PADS

[75] Inventors: Kenichi Yasuda; Kiyohiro Furutani; Hiroshi Miyamoto, all of Hyogo, Japan

[73] Assignee: Mitsubishi Denki Kabushiki Kaisha, Tokyo, Japan

[21] Appl. No.: 292,301

[22] Filed: Aug. 18, 1994

[30] Foreign Application Priority Data

Sep. 9, 1993 [JP] Japan .................................. 5-224481
Jul. 14, 1994 [JP] Japan .................................. 6-162087

[51] Int. Cl.⁶ ............................. H01L 23/48; H01L 23/52
[52] U.S. Cl. ........................... 257/690; 257/296; 257/784
[58] Field of Search .................................. 257/659, 687, 257/784, 786, 296, 169

[56] References Cited

U.S. PATENT DOCUMENTS

| | | | |
|---|---|---|---|
| 4,956,811 | 9/1990 | Kajigaya et al. | 365/51 |
| 5,208,782 | 5/1993 | Sakuta et al. | 365/230.03 |
| 5,252,854 | 10/1993 | Arita et al. | 257/676 |
| 5,332,922 | 7/1994 | Oguchi et al. | 257/723 |
| 5,381,036 | 1/1995 | Bigler et al. | 257/666 |

FOREIGN PATENT DOCUMENTS 3-214669  9/1991  Japan .

OTHER PUBLICATIONS

Articles of Spring Seminar, Institute of Electronics, Information and Communication Engineers of Japan, 1993, vol. 5, pp. 5–267.

*Primary Examiner*—Mahshid Saadat
*Assistant Examiner*—T. M. Arroyo
*Attorney, Agent, or Firm*—Lowe, Price, LeBlanc & Becker

[57] ABSTRACT

A DRAM includes a package, a semiconductor chip housed in the package, and a plurality of leads each disposed from the outside of the package over the periphery of the semiconductor chip. The power supply potential is applied to some of the leads. Corresponding to one power supply lead, one power supply pad and one selection pad are formed. Corresponding to another power supply lead, another power supply pad and another selection pad are formed. Each of these two selection pads is connected or not connected to the corresponding power supply lead by bonding. As a result, one of four word configurations is selected. Since these two selection pads are disposed in the vicinity of the corresponding power supply leads, respectively, the number of times of bonding to one power supply lead is reduced.

9 Claims, 15 Drawing Sheets

FIG.3

| Pin | # | # | Pin |
|---|---|---|---|
| Vcc | 1 | 54 | Vss |
| DQ0 | 2 | 53 | DQ15 |
| DQ1 | 3 | 52 | DQ14 |
| DQ2 | 4 | 51 | DQ13 |
| DQ3 | 5 | 50 | DQ12 |
| Vcc | 6 | 49 | Vss |
| DQ4 | 7 | 48 | DQ11 |
| DQ5 | 8 | 47 | DQ10 |
| DQ6 | 9 | 46 | DQ9 |
| DQ7 | 10 | 45 | DQ8 |
| NC | 11 | 44 | NC |
| Vcc | 12 | 43 | Vss |
| $\overline{W}$ | 13 | 42 | $\overline{LCAS}$ |
| $\overline{RAS}$ | 14 | 41 | $\overline{UCAS}$ |
| NC | 15 | 40 | $\overline{OE}$ |
| NC | 16 | 39 | NC |
| NC | 17 | 38 | NC |
| NC | 18 | 37 | NC |
| NC | 19 | 36 | NC |
| NC | 20 | 35 | A12 |
| A0 | 21 | 34 | A11 |
| A1 | 22 | 33 | A10 |
| A2 | 23 | 32 | A9 |
| A3 | 24 | 31 | A8 |
| A4 | 25 | 30 | A7 |
| A5 | 26 | 29 | A6 |
| Vcc | 27 | 28 | Vss |

4M×16

SEMICONDUCTOR INTEGRATED CIRCUIT DEVICE HAVING IMPROVEMENT ARRANGEMENT OF PADS

BACKGROUND OF THE INVENTION

1. Field of the Invention

The present invention generally relates to semiconductor integrated circuit devices, and more particularly, to an improvement of an arrangement of pads on a semiconductor chip.

2. Description of the Background Art

A dynamic random access memory (hereinafter referred to as a "DRAM") is one of semiconductor integrated circuit devices which are produced relatively in large quantity. Table 1 shows one example of items of a 64-mega bit DRAM.

TABLE 1

| Word con- figuration | x1 | x4 | x8 | x16 | |
|---|---|---|---|---|---|
| Operation mode | Fast page Static column Nibble | Fast page Static column Nibble | Fast page Static column | 1 CAS 2 WE Fast page Static column | 2 CAS 1 WE Fast page Static column |

As is shown in Table 1, the word configuration includes a "x1 configuration", a "x4 configuration", a "x8 configuration", and a "x16 configuration". The operation mode corresponding to the "x1 configuration" includes a "fast page mode", a "static column mode", and a "nibble mode". The operation mode corresponding to the "x4 configuration" includes the same modes as those corresponding to the "x1 configuration". The operation mode corresponding to the "x8 configuration" includes the "fast page mode" and the "static column mode". The operation mode corresponding to the "x16 configuration" includes a mode having one column address strobe signal (CAS) and two write enable signals (WE), and a mode having two column address strobe signals (CAS) and one write enable signal (WE). Each of the modes further includes the "fast page mode", and the "static column mode".

These items are identical to each other in the center portion such as a memory cell, and only different from each other in a part of the peripheral circuit. Therefore, item-by-item development thereof is not economical.

A method is employed of producing respective items by mounting a circuit having a plurality of functions on a semiconductor chip and switching the circuit. A method of switching includes a method of switching the circuit by changing patterning of an interconnection layer, and a method of switching the circuit by wire bonding.

FIG. 15 is a plan view showing a part of a conventional semiconductor integrated circuit device in which items are switched by bonding. Referring to FIG. 15, a plurality of leads 3 are disposed on a semiconductor chip 2. These leads 3 project outside through a package (not shown) housing semiconductor chip 2. The projected portions configure external pins of the semiconductor integrated circuit device. Such a configuration in which leads 3 are disposed on semiconductor chip 2 is called LOC (Lead On Chip).

A plurality of power supply pads 4 are arranged on semiconductor chip 2. Respective power supply pads 4 are connected to power supply leads 3 to which power supply potential Vcc or Vss is applied via wires 5. These wires 5 are formed by bonding.

Two selection pads MS1, MS2 are disposed adjacent to power supply pads 4 on semiconductor chip 2. By connecting these selection pads MS1, MS2 to corresponding power supply leads 3 via wires 5 or not, items are switched.

FIG. 16 is a selecting circuit shown in FIG. 2, page 5–267 of Vol. 5, *Articles of Spring Seminar, Institute of Electronics, Information and Communication Engineers of Japan*, 1993. Referring to FIG. 16, when selection pad MS1 is connected to power supply lead 3 to which ground potential Vss is applied, the potential of selection pad MS1 attains ground potential Vss. As a result, an L (logic low) level corresponding to ground potential Vss is output through two series connected inverters 704, 706. Therefore, in this case, an internal mode select signal MSI at an L level is provided.

On the other hand, when selection pad MS1 is not connected to any leads, the potential of selection pad MS1 is pulled up to power supply potential Vcc by a P channel MOS transistor 702. As a result, an H (logic high) level corresponding to power supply potential Vcc is output through two inverters 704, 706. Therefore, in this case, mode select signal MSI attains an H level.

As described above, selection pad MS1 has either a connection state to power supply lead 3 or a disconnection state therefrom, and selection pad MS2 also has either a connection state to power supply lead 3 or a disconnection state therefrom. Therefore, switching among four items can be carried out depending on whether selection pads MS1, MS2 are connected to power supply leads 3 or not.

In a conventional semiconductor integrated circuit device, however, there was a case where two selection pads MS1, MS2 are both connected to one power supply lead 3, as shown in FIG. 15. Bonding of a plurality of wires 5 to one power supply lead 3 has the following problems.

First, when the first wire 5 is bonded and then second wire 5 is bonded, the second wire must be bonded at a position different from a position of bonding of the first wire. This is because bonding of the second wire 5 at the same position as that of the first wire decouples or disconnects the first wire 5 by the shock. Therefore, the width of lead 3 must be relatively wide. However, since lead 3 must be spaced from its adjacent lead, the width of lead 3 cannot be extremely increased.

Second, semiconductor chip 2 is damaged at the time of bonding. FIG. 17 is a side view showing the relationship between semiconductor chip 2 and lead 3 shown in FIG. 15. As is indicated by a dotted line in FIG. 17, lead 3 is bent by a bonding arm 9 at the time of bonding, which sometimes brings the tip of lead 3 into contact with the surface of semiconductor chip 2. If bonding is carried out to one lead 3 a plurality of times, the same place on semiconductor chip 2 is repeatedly subjected to damage. Lead 3 is also subjected to damage repeatedly. Therefore, it is desired that the number of times of bonding to one lead 3 is smaller.

It should be noted that there is a product called reverse bend other than items shown in Table 1. The reverse bend product has a pin arrangement in symmetry with respect to that of a normal product, that is, a normal bend product (non-reverse bend product). By packaging a normal bend product in the front side of a double sided printed circuit board and a reverse bend product in the rear side thereof, respective pins of the normal bend product can be connected to corresponding pins of the reverse bend product.

These normal and reverse bend products can be produced by bending lead 3 to the lower side or to the upper side in the figure after molding semiconductor chip 2 by a package 1, as shown in the right side of FIG. 18. When such a method is employed, lead 3 must be disposed at the center C in the thickness direction of package 1. However, as shown in the left side of FIG. 18, it is difficult to dispose lead 3 at the center C in the case of a package of an LOC type. Similarly, it is difficult to dispose lead 3 at the center C in the case of a super thin package called TSOP. If lead 3 cannot be disposed at the center in the thickness direction of package 1, the shape of lead 3 is different between the normal bend product and the reverse bend product.

SUMMARY OF THE INVENTION

The present invention is for solving the above-described problems. One object of the present invention is to reduce the number of times of wire bonding to one lead in a semiconductor integrated circuit device which can switch among items by bonding.

Another object of the present invention is to prevent an already bonded wire from decoupling at the time of bonding another wire.

Still another object of the present invention is to reduce damage to which a semiconductor chip is subjected at the time of wire bonding.

A further object of the present invention is to reduce the number of times of wire bonding in a semiconductor integrated circuit device which is produced in large quantity.

A further object of the present invention is to produce a DRAM having various word configurations in the step of wire bonding.

A further object of the present invention is to produce normal and reverse bend products with one kind of lead.

A further object of the present invention is to produce normal and reverse bend products of an LOC type.

The semiconductor integrated circuit device according to one aspect of the present invention includes a package, a semiconductor chip, a plurality of leads, first and second power supply pads, first and second selection pads, and a first selecting circuit. The semiconductor chip, housed in the package, carries out any of a plurality of first predetermined operations. Each of the plurality of leads is disposed from the outside of the package over the periphery of the semiconductor chip. The plurality of leads include first and second power supply leads. The first power supply lead receives a power supply potential. The second power supply lead is positioned apart from the first power supply lead, and receives a power supply potential which is the same as or different from the power supply potential received by the first power supply lead. The first supply pad is disposed on the semiconductor chip, and connected to the first power supply lead. The second power supply pad is disposed on the semiconductor chip and connected to the second power supply lead. The first selection pad is disposed in the vicinity of the first power supply lead on the semiconductor chip, and has either a connection state to the first power supply lead or a disconnection state therefrom. The second selection pad is disposed in the vicinity of the second power supply lead on the semiconductor chip, and has either a connection state to the second power supply lead or a disconnection state therefrom. The first selecting circuit selects any of the plurality of first predetermined operations in response to the connection/disconnection states of the first and second selection pads.

Preferably, the semiconductor chip further carries out any of a plurality of second predetermined operations. The plurality of leads also include third and fourth power supply leads. The third power supply lead receives a power supply potential which is the same as or different from the power supply potential received by the first power supply lead. The fourth power supply lead is positioned apart from the third power supply lead, and receives a power supply potential which is the same as or different from the power supply potential received by the first power supply lead. The semiconductor integrated circuit device further includes third and fourth power supply pads, third and fourth selection pads, and a second selecting circuit. The third power supply pad is disposed on the semiconductor chip and connected to the third power supply lead. The fourth power supply pad is disposed on the semiconductor chip and connected to the fourth power supply lead. The third selection pad is disposed in the vicinity of the third power supply lead on the semiconductor chip, and has either a connection state to the third power supply lead or a disconnection state therefrom. The fourth selection pad is disposed in the vicinity of the fourth power supply lead on the semiconductor chip, and has either a connection state to the fourth power supply lead or a disconnection state therefrom. The second selecting circuit selects any of the plurality of second predetermined operations in response to the operation selected by the first selecting circuit and the connection/ disconnection state of the third and fourth selection pads.

The semiconductor integrated circuit device according to another aspect of the present invention includes a package, a semiconductor chip, a plurality of leads, a plurality of first and second selection pads, and first and second selecting circuits. The semiconductor chip, housed in the package, carries out any of the plurality of first predetermined operations, and any of the plurality of second predetermined operations. Each of the plurality of leads is disposed from the outside of the package over the periphery of the semiconductor chip. The plurality of first selection pads are disposed corresponding to any of the plurality of leads on the semiconductor chip. Each of the plurality of first selection pads has either a connection state to a corresponding lead or a disconnection state therefrom. The first selecting circuit selects any of the plurality of first predetermined operations in response to the connection/disconnection states of the plurality of first selection pads. The plurality of second selection pads are disposed corresponding to any of the plurality of leads on the semiconductor chip. Each of the plurality of second selection pads has either a connection state to a corresponding lead or a disconnection state therefrom. The second selecting circuit selects any of the plurality of second predetermined operations in response to the operation selected by said first selecting means and the connection/disconnection states of the plurality of second selection pads.

Preferably, the semiconductor chip is a semiconductor memory device which can read/write data for every number determined by the first selecting circuit.

The semiconductor integrated circuit device according to still another aspect of the present invention includes a package, a semiconductor chip, a plurality of leads, and a plurality of pads. The semiconductor chip is housed in the package. The plurality of leads are disposed along two opposing sides of the package. Each of the plurality of leads is disposed from the outside of the package over the periphery of the semiconductor chip. The plurality of pads are disposed corresponding to the plurality of leads in parallel with the two opposing sides on the semiconductor chip. One of two pads corresponding to two leads opposing to each other is connected to one of the two leads. The other of the two pads is connected to the other of the two leads. The two pads are disposed adjacent to each other.

Preferably, each one end portion of the plurality of leads is disposed over the semiconductor chip.

Therefore, in the above-described semiconductor integrated circuit device, since two selection pads are disposed in the vicinity of two power supply leads spaced from each other, the number of times of bonding to each of the power supply leads is reduced.

In the semiconductor integrated circuit device, the operation selected by the third and fourth selection pads is different depending on the operation selected by the first and second selection pads, the number of times of bonding to respective power supply leads is reduced in a semiconductor integrated circuit device carrying out a predetermined operation, for example, in a semiconductor integrated circuit device which is produced in large quantity.

In the semiconductor integrated circuit device, since the number of data read or written at one time is determined by the first selecting circuit, a semiconductor integrated circuit device having various word configurations can be produced.

In the semiconductor integrated circuit device, since two leads opposing to each other are alternatively connected to their corresponding two pads, normal and reverse bend type semiconductor integrated circuit devices can be produced using one kind of lead. In addition, since the corresponding two pads are disposed adjacent to each other, a wire bonded between the two opposing leads and the corresponding two pads does not come in contact with other bonding wires.

In the semiconductor integrated circuit device, each one end portion of the leads is disposed over the semiconductor chip. In other words, an LOC structure is employed, whereby the number of times of bonding to the lead is decreased. Therefore, it is prevented that the same place on the semiconductor chip is repeatedly subjected to damage. Normal and reverse bend type semiconductor integrated circuit devices having an LOC structure can be easily produced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram showing a pin arrangement of a DRAM having a "x16 configuration".

DESCRIPTION OF THE PREFERRED EMBODIMENTS

Embodiments of the present invention will be described in detail with reference to the drawings.

Embodiment 1

Figure 2:
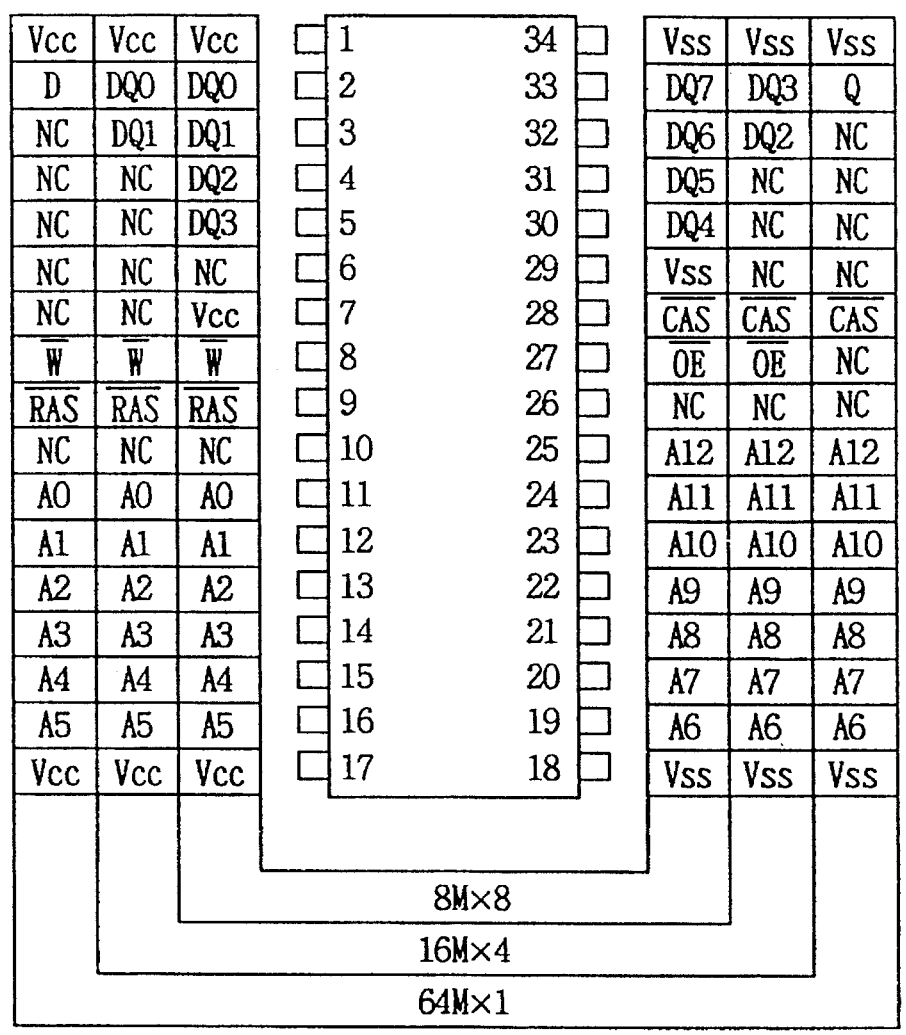
FIG. 2 is a diagram showing a pin arrangement of a DRAM having a "x1 configuration", a "x4 configuration" and a "x8 configuration".

FIG. 2 shows a general pin arrangement of a 64-mega bit DRAM having a "x1 configuration", a "x4 configuration" and a "x8 configuration". Referring to FIG. 2, the DRAM has 34 leads. The tip portion of each lead projects from a package to configure an external pin. In FIG. 2, Vcc denotes the power supply potential, and Vss denotes the ground potential. A0 to A12 denote address signals, and D, Q, DQ0 to DQ7 denote data signals. $\overline{RAS}$ denotes a row address strobe signal, and $\overline{CAS}$ denotes a column address strobe signal. $\overline{W}$ denotes a write enable signal, and $\overline{OE}$ denotes an output enable signal.

As shown in FIG. 2, in the "x1 configuration" and the "x4 configuration", the power supply potential Vcc is applied to the first pin and the seventeenth pin on both ends, and the ground potential Vss is applied to the eighteenth pin and the thirty-fourth pin on both ends opposing to the first and seventeenth pins. On the other hand, in the "x8 configuration", the power supply potential Vcc is further applied to the seventh pin around the center, and the ground potential Vss is further applied to the twenty-ninth pin around the center opposing to the seventh pin.

FIG. 3 shows a general pin arrangement of a 64-mega bit DRAM having the "x16 configuration". As shown in FIG. 3, in the "x16 configuration", the power supply potential Vcc is applied to the first pin and the twenty-seventh pin on both ends, and further applied to the sixth pin and the twelfth pin around the center. The ground potential Vss is applied to the twenty-eighth pin and the fifty-fourth pin on both ends opposing to the sixth and twelfth pins, and further applied to the forty-third pin and the forty-ninth pin around the center opposing to the twenty-eighth and fifty-fourth pins.

In the "x1 configuration", one 64-mega bit memory cell array is provided, and data is read out from a desired memory cell for every one bit, or written in the memory cell for every one bit. In the "x4 configuration", four 16-mega bit memory cell arrays are provided, and data is read out from four desired memory cells for four bits, or written in the four memory cells for every four bits. In the "x8 configuration", eight 8-mega bit memory cell arrays are provided, and data is read out from eight desired memory cells for every eight bits, or written in the eight memory cells for every eight bits. In the "x16 configuration", sixteen 4-mega bit memory arrays are provided, and data is read out from 16 desired memory cells for every 16 bits, or written in the 16 memory cells for every 16 bits.

Figure 1:
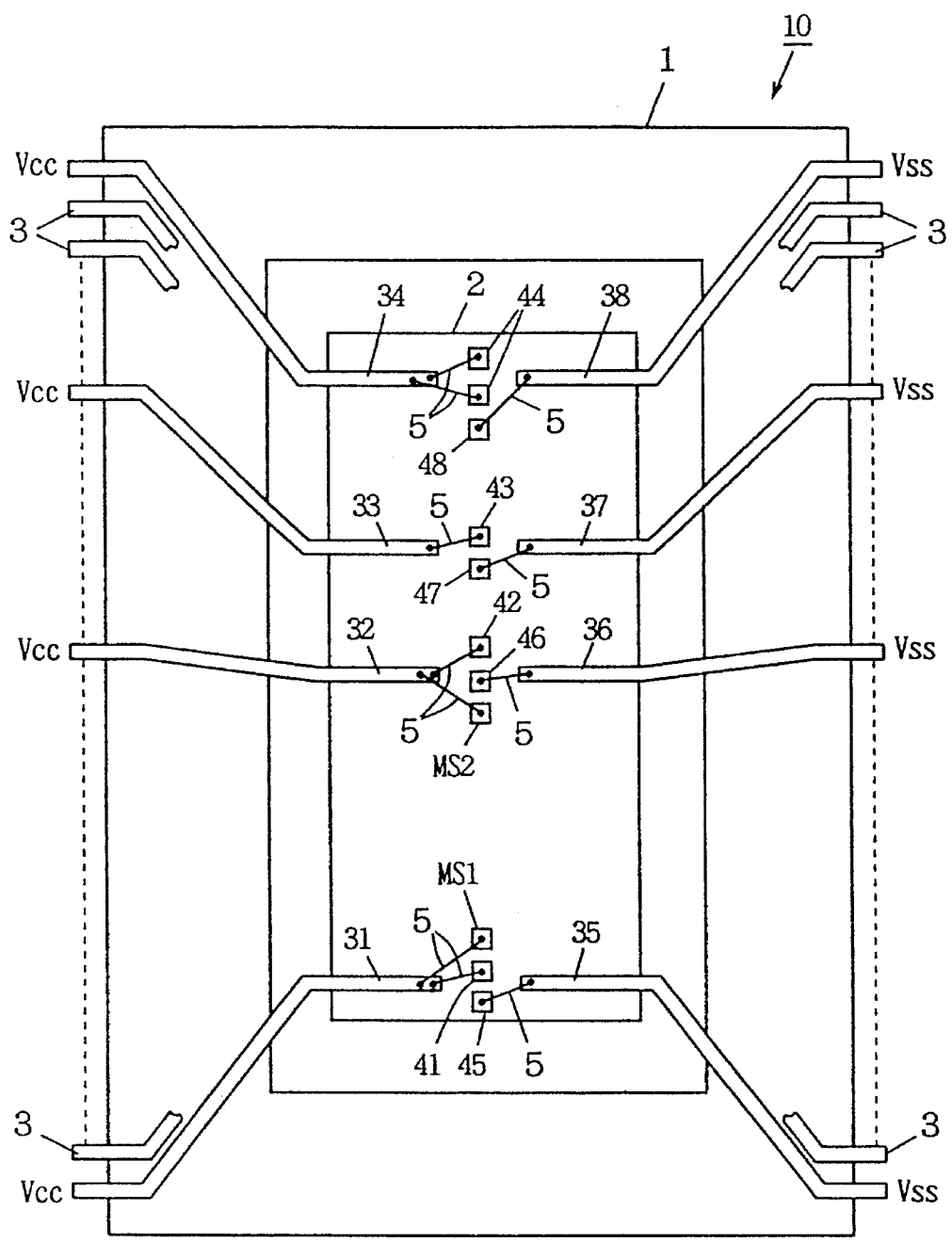
FIG. 1 is a plan view showing a configuration of a DRAM according to Embodiment 1 of the present invention.

FIG. 1 is a plan view showing the entire configuration of the DRAM according to Embodiment 1 of the present invention. The DRAM 10 has a "x16 configuration", and a 64-mega bit storage capacity.

Referring to FIG. 1, DRAM 10 include a package 1 made of resin or the like, a semiconductor chip 2 housed in package 1, and a plurality of leads 3, 31–38 disposed along two opposing sides of package 1. Each lead is disposed from the outside of package 1 over the periphery of the semiconductor chip. One end portion of each lead extends over semiconductor chip 2. Therefore, the DRAM has an LOC structure.

On semiconductor chip 2, a plurality of power supply pads 41–48 are formed in parallel with two opposing sides of package 1. Power supply pad 41 is connected to power supply lead 31 to which the power supply potential Vcc is applied via a wire 5. Power supply pad 42 is connected to power supply lead 32 to which the power supply potential Vcc is applied via wire 5. Power supply pad 43 is connected to power supply lead 33 to which the power supply potential Vcc is applied via wire 5. Power supply pad 44 is connected to power supply lead 34 to which the power supply potential Vcc is applied via wire 5. Power supply pad 45 is connected to power supply lead 35 to which the ground potential Vss is applied via wire 5. Power supply pad 46 is connected to power supply lead 36 to which the ground potential Vss is applied via wire 5. Power supply pad 47 is connected to power supply lead 37 to which the ground potential Vss is applied via wire 5. Power supply pad 48 is connected to power supply lead 38 to which the ground potential Vss is applied via wire 5.

Two selection pads MS1, MS2 are further formed on semiconductor chip 2. Selection pad MS1 is disposed adjacent to power supply pad 41 in the vicinity of power supply lead 31. Selection pad MS2 is disposed adjacent to power supply pad 46 in the vicinity of power supply lead 32. It should be noted that selection pad MS1 is connected to corresponding power supply lead 31 via wire 5, and that selection pad MS2 is connected to corresponding power supply lead 32 via wire 5 in FIG. 1.

Figure 4:
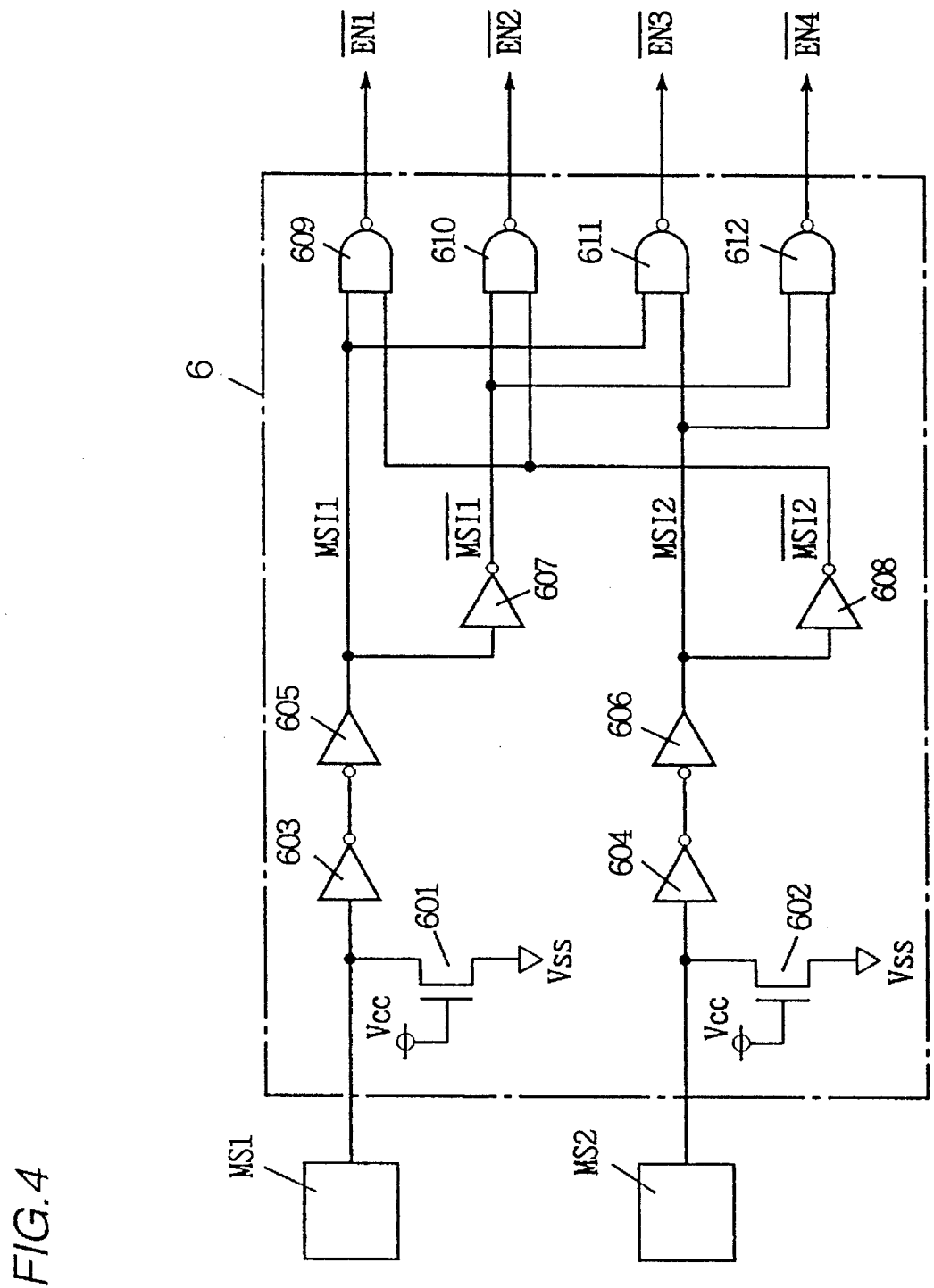
FIG. 4 is a circuit diagram showing a word configuration selecting circuit in the DRAM shown in FIG. 1.

FIG. 4 is a circuit diagram showing a word configuration selecting circuit mounted on semiconductor chip 2. Referring to FIG. 4, a selecting circuit 6 includes an N channel MOS transistor 601 connected between selection pad MS1 and a node of the power supply potential Vss, and an N channel MOS transistor 602 connected between selection pad MS2 and a node of power supply potential Vss. The gate electrodes of these transistors 601, 602 are supplied with the power supply potential Vcc.

Selecting circuit 6 further includes six inverters 603 to 608, and four NAND gates 609 to 612. Selection pad MS1 is connected to one input node of NAND gate 609 and one input node of NAND gate 611 through series connected inverters 603 and 605. The output node of inverter 605 is connected to one input node of NAND gate 610 and one input node of NAND gate 612 through inverter 607.

Selection pad MS2 is connected to the other input node of NAND gate 611 and the other input node of NAND gate 612 through series connected inverters 604 and 606. The output node of inverter 606 is connected to the other input node of NAND gate 609 and the other input node of NAND gate 610 through inverter 608. NAND gate 609 provides an enable signal $\overline{EN1}$ for activating the "x1 configuration". NAND gate 610 provides an enable signal $\overline{EN2}$ for activating the "x4 configuration". NAND gate 611 provides an enable signal $\overline{EN3}$ for activating the "x8 configuration". NAND gate 612 provides an enable signal $\overline{EN4}$ for activating the "x16 configuration".

Table 2 shows the correspondence between the connection/disconnection state of selection pads MS1, MS2 and the word configuration.

TABLE 2

| Word configuration | MS1 | MS2 |
|---|---|---|
| x1 | Vcc | OPEN |
| x4 | OPEN | OPEN |
| x8 | Vcc | Vcc |
| x16 | OPEN | Vcc |

OPEN: Non-Connection

As is shown in Table 2, selection pads MS1 and MS2 respectively have a connection state to a power supply lead to which the power supply potential Vcc is applied, and an open state not connected to any power supply leads. More specifically, there are cases where selection pad MS1 is connected to corresponding power supply lead 31 and where selection pad MS1 is not connected to power supply lead 31. Similarly, there are cases where selection pad MS2 is connected to corresponding power supply lead 32, and where selection pad MS2 is not connected to power supply lead 32.

When selection MS1 is connected to corresponding power supply lead 31, and selection pad MS2 is not connected to any power supply leads, that is, selection pad MS2 is in an open state, for example, an H level is applied to inverter 603 in selecting circuit 6. In response to this, a mode select signal MSI1 at an H level is applied to NAND gates 609 and 611. In addition, a mode select signal MSI1 at an L level is applied to NAND gates 610 an 612. On the other hand, the potential of selection pad MS2 is pulled down to the ground potential Vss by transistor 602, whereby an L level is applied to inverter 604. In response to this, a mode select signal MSI2 at an L level is applied to NAND gates 611 and 612. In addition, a mode select signal MSI 2 at an H level is applied to NAND gates 609 and 610. Therefore, only enable signal $\overline{EN1}$ attains an L level, resulting in activation of the "x1 configuration".

When both selection pads MS1 and MS2 are in an open state, only enable signal $\overline{EN2}$ attains an L level, resulting in activation of the "x4 configuration".

When selection pad MS1 is connected to corresponding power supply lead 31, and selection pad MS2 is connected to corresponding power supply lead 32, only enable signal $\overline{EN3}$ attains an L level, resulting in activation of the "x8 configuration".

When selection pad MS1 is in an open state, and selection pad MS2 is connected to corresponding power supply lead 32, only enable signal $\overline{EN4}$ attains an L level, resulting in activation of the "x16 configuration".

As is shown in FIGS. 2 and 3, the power supply potential Vcc is applied to only leads on both ends in the "x1 configuration" and "x4 configuration" DRAMs. On the other hand, the power supply potential Vcc is applied not only to leads on both ends but also to a lead around the center in the "x8 configuration" DRAM. In addition, the power supply potential Vcc is applied not only to leads on both ends but also to two leads around the center in the "x16 configuration" DRAM.

Therefore, as shown in FIG. 1, in DRAM 10 according to Embodiment 1, selection pad MS2 is disposed in the vicinity of power supply lead 32 around the center to which the power supply potential Vcc is applied.

In the case of the "x1 configuration" or "x4 configuration", the power supply potential Vcc is not applied to power supply lead 32, and selection pad MS2 is not connected to power supply lead 32. When selection pad MS1 is connected to power supply lead 31 via bonding wire 5 in an open state of selection pad MS2, the power supply potential Vcc is applied to power supply pad MS1, resulting in selection of the "x1 configuration" as described above. On the other hand, when not only selection pad MS2 but also selection pad MS1 is in an open state, the "x4 configuration" is selected.

As described above, in the "x1 configuration" or "x4 configuration", selection pad MS2 is disposed in the vicinity of power supply lead 32 to which the power supply potential Vcc is not applied. However, since the "x1 configuration" or "x4 configuration" is selected in an open state of selection pad MS2, there is no problem.

In the cases of the "x8 configuration" and the "x16 configuration", the power supply potential Vcc is applied to power supply lead 32. Therefore, when selection pad MS2 is connected to power supply lead 32 via bonding wire 5, the "x8 configuration" or "x16 configuration" is selected. In this case, the "x8 configuration" is selected when selection pad MS1 is connected to power supply lead 31 via bonding wire 5. On the other hand, the "x16 configuration" is selected when selection pad MS1 is in an open state.

Figure 15:
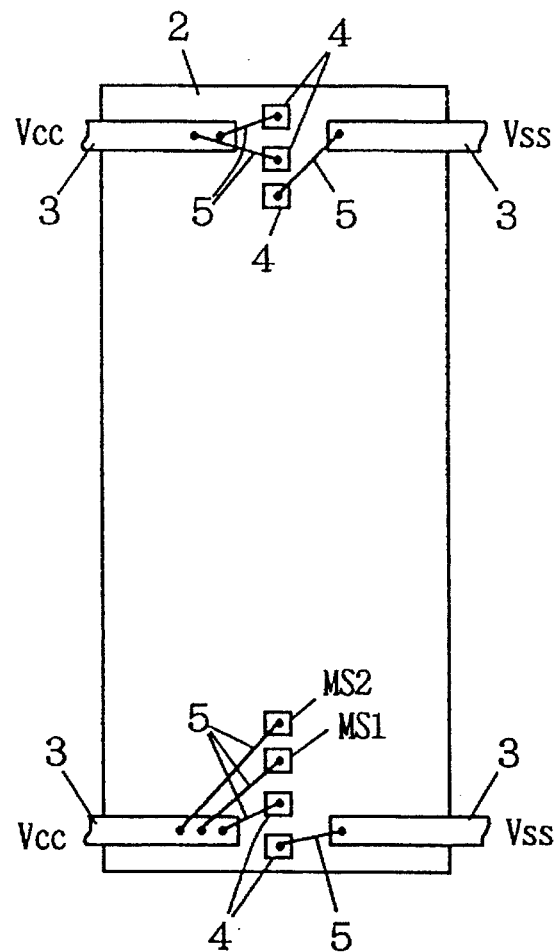
FIG. 15 is a plan view showing a part of a configuration of a conventional DRAM.
Figure 16:
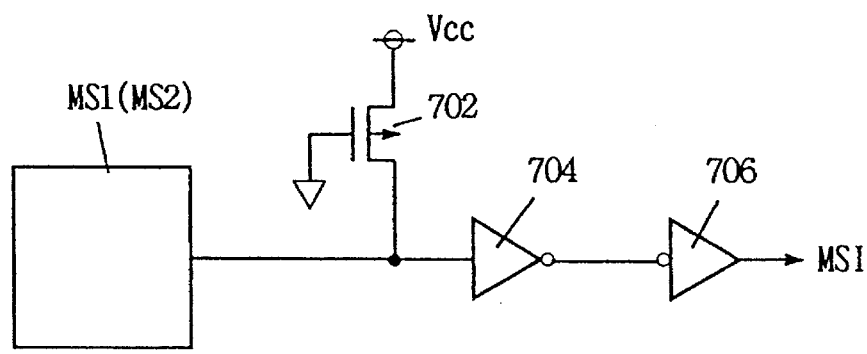
FIG. 16 is a circuit diagram showing a conventional selecting circuit.
Figure 17:
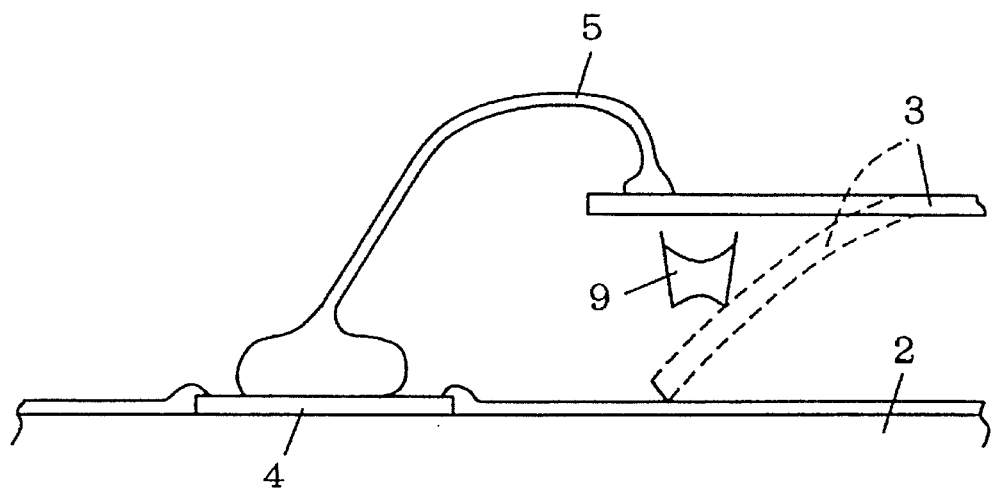
FIG. 17 is a side view for explaining problems at the time of bonding of the DRAM shown in FIG. 15.

When the "x8 configuration" is selected in the conventional DRAM shown in FIG. 15, both selection pads MS1 and MS2 are connected to power supply lead 3, resulting in bonding of three wires 5 to power supply lead 3. On the other hand, when the "x8 configuration" is selected in DRAM 10 according to Embodiment 1, selection pad MS1 is connected to power supply lead 31 and selection pad MS2 is connected to power supply lead 32, resulting in bonding of two wires 5 to power supply lead 31.

When the "x16 configuration" is selected, selection pad MS2 is connected to power supply lead 3 in the conventional DRAM shown in FIG. 15, resulting in bonding of two wires 5 to power supply lead 3. On the other hand, in DRAM 10 of Embodiment 1, selection pad MS2 is connected to power supply lead 32, resulting in bonding of one wire 5 to power supply lead 31.

As described above, since the number of times of bonding to power supply lead 31 is decreased as compared to the conventional case, wire 5 which has already been bonded is less likely to be decoupled or disconnected when another wire 5 is bonded. In addition, since the number of times of contact of the tip of power supply lead 31 with the surface of semiconductor chip 2 is also decreased, damage to semiconductor chip 2 is reduced.

DRAM 10 is manufactured by the following steps. First, several wells are formed on a silicon wafer. Then, devices such as a transistor, a capacitor or the like are formed. Metal interconnections are formed hierarchically, and a passivation film is further formed. At this time, the manufactured wafer is tested.

Then, the manufactured wafer is diced, and semiconductor chip 2 is manufactured. Semiconductor chip is housed in package 1. Wires 5 are bonded between pads 41–48, MS1, MS2 and leads 3, 31–38 on semiconductor chip 2. The word configuration is selected depending on whether selection pads MS1, MS2 are bonded or not. After the final test of the completed DRAM 10, DRAM 10 is shipped.

In the DRAM having a multi-bit configuration such as the "x8 configuration", "x16 configuration" or the like, items such as a "2 CAS", a "4 CAS" or the like peculiar to the multi-bit configuration are increased recently. In the DRAM having the multi-bit configuration, the number of leads to which the power supply potential Vcc or the ground potential Vss is applied is increased. Therefore, if selection pads are additionally disposed in the vicinity of power supply leads to which the power supply potential Vcc or the like is applied, the selection pads are to be dispersed, resulting in decrease of the number of times of bonding to one lead.

In Embodiment 1, the word configuration is selected depending on whether selection pads MS1, MS2 are connected to power supply lead 31, 32. However, the word configuration may be selected depending on whether selection pads MS1, MS2 are connected to power supply leads 35, 36 to which the ground potential Vss is applied. In addition, the word configuration may be selected depending on whether selection pads MS1, MS2 are connected to power supply leads 31, 32, connected to power supply leads, 35, 36, or not connected to any power supply leads. In this case, since one selection pad can alternatively have three states, one kind of word configuration can be selected from nine kinds of word configurations theoretically.

Embodiment 2

Figure 5:
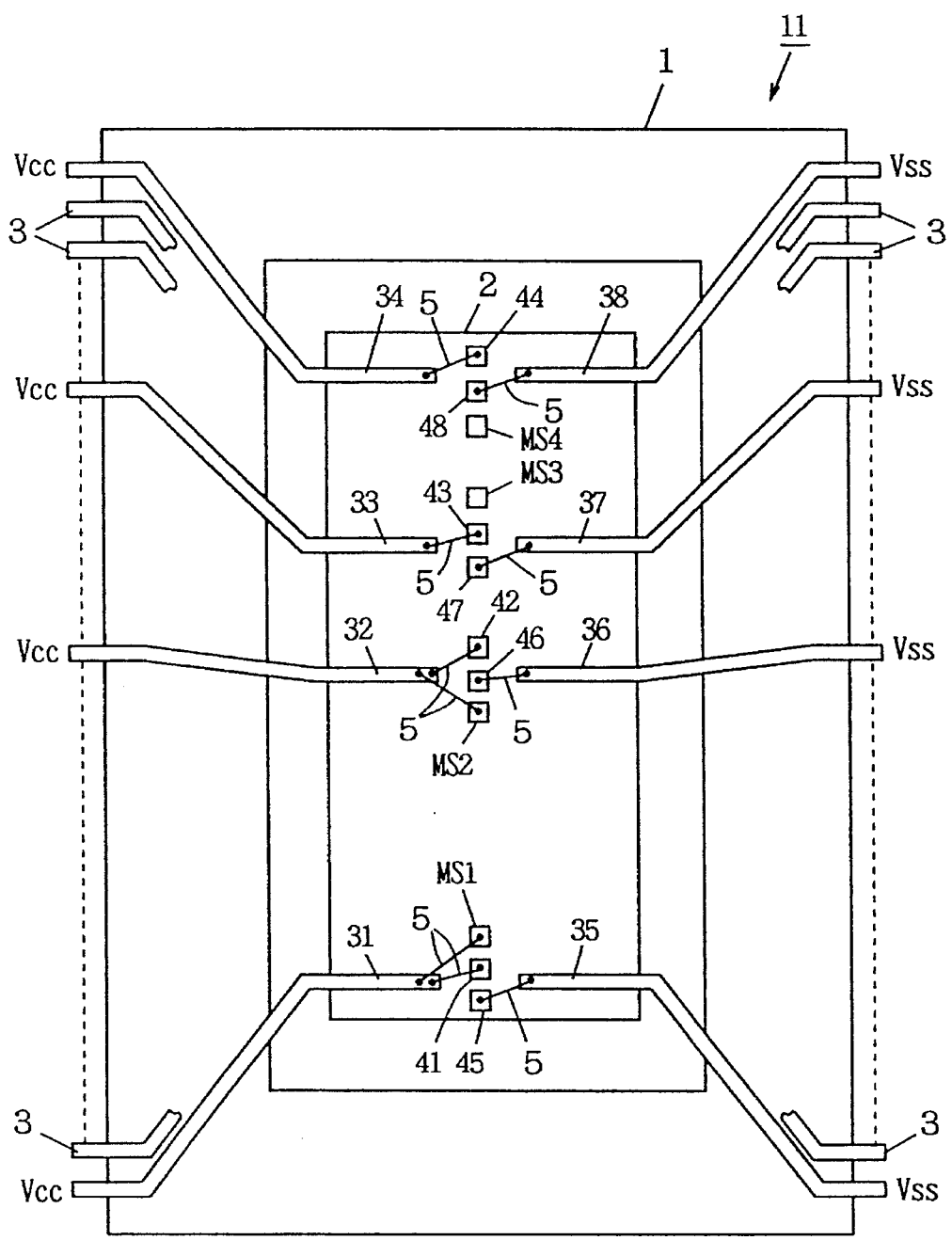
FIG. 5 is a plan view showing a configuration of a DRAM according to Embodiment 2 of the present invention.

FIG. 5 is a plan view showing the configuration of the DRAM according to Embodiment 2 of the present invention. The same or corresponding portions as or to those of Embodiment 1 are labeled with the same reference characters, and the description thereof will not be repeated.

Referring to FIG. 5, two more selection pads MS3, MS4 are formed in the vicinity of power supply leads 33, 38, respectively, on semiconductor chip 2 in a DRAM 11.

Selection pad MS3 is connected or not connected to power supply lead 33. Selection pad MS4 is connected or not connected to power supply lead 38.

Selection pads MS1 and MS2 are connected to word configuration selecting circuit 6 shown in FIG. 4, similar to the case of Embodiment 1. One of the four word configurations is selected depending on whether selection pads MS1, MS2 are connected to a power supply lead to which the power supply potential Vcc is applied, or selection pads MS1, MS2 are in an open state.

Figure 6:
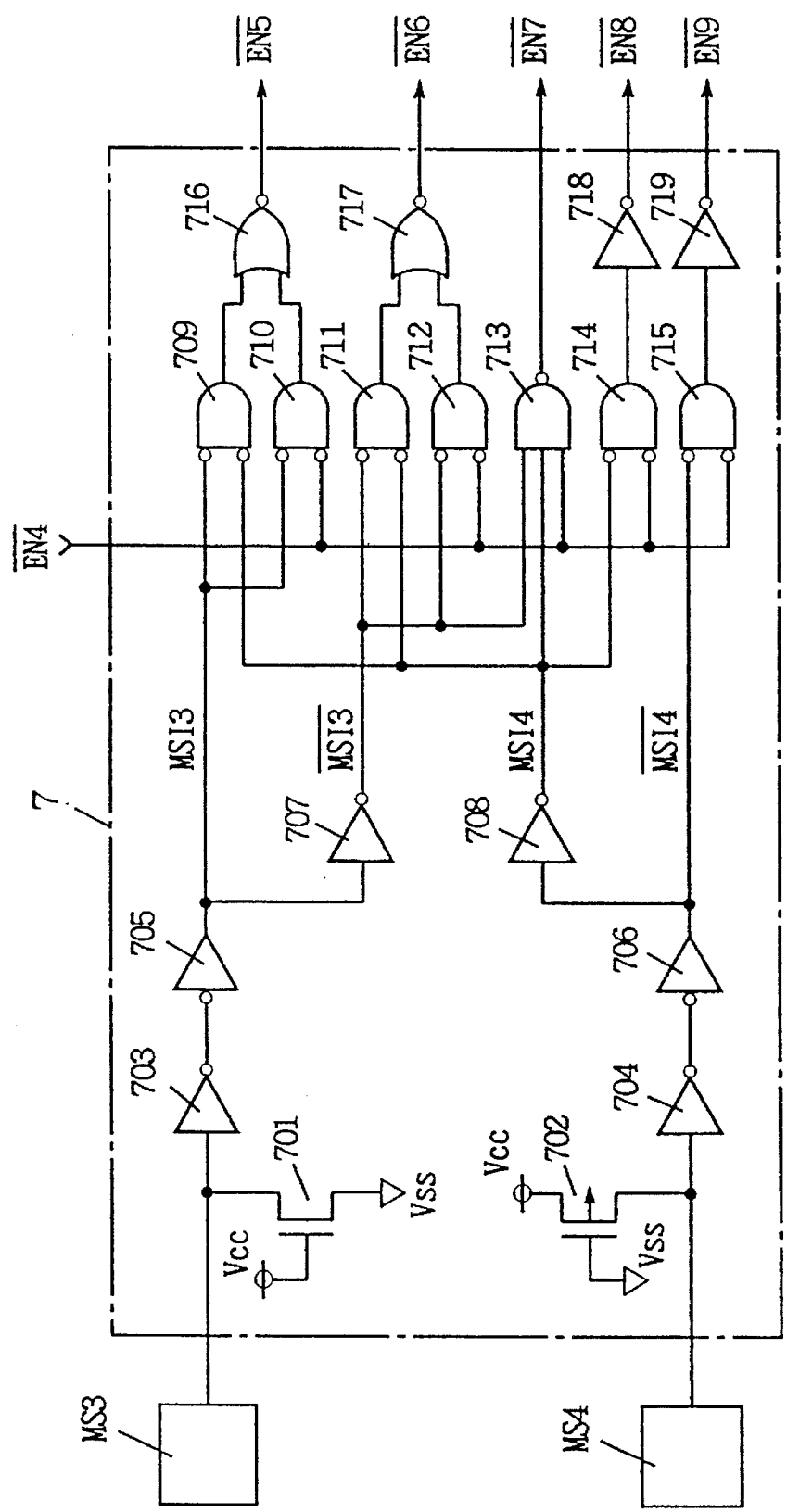
FIG. 6 is a circuit diagram showing an operation mode selecting circuit in the DRAM shown in FIG. 5.

Selection pads MS3 and MS4 are connected to an operation mode selecting circuit 7 shown in FIG. 6. Referring to FIG. 6, operation mode selecting circuit 7 includes an N channel MOS transistor 701 connected between selection pad MS3 and a node of the ground potential Vss, and a P channel MOS transistor 702 connected between selection pad MS4 and a node of the power supply potential Vcc. The gate electrode of transistor 701 is supplied with the power supply potential Vcc, and the gate electrode of transistor 702 is supplied with the ground potential Vss.

Selecting circuit 7 further includes eight inverters 703 to 708, 718, 719, and nine logic gates 709 to 717.

Selection pad MS3 is connected to one input node of logic gate (NOR gate) 709 and one input node of logic gate (NOR gate) 710 through series connected inverters 703 and 705.

The output node of inverter 705 is connected to one input node of logic gate (NOR gate) 711 and one input node of logic gate (NOR gate) 712, and further connected to one input node of NAND gate 713 all through inverter 707. The output nodes of logic gates 709 and 710 are respectively connected to the input nodes of NOR gate 716. NOR gate 716 provides an enable signal $\overline{EN5}$ for activating the "fast page mode". The output nodes of logic gates 711 and 712 are respectively connected to the input nodes of NOR gate 717. NOR gate 717 provides an enable signal $\overline{EN6}$ for activating the "static column mode".

Selection pad MS4 is connected to one input node of logic gate (NOR gate) 715 through series connected inverters 704 and 706. The output node of inverter 706 is connected to the other input node of logic gate 709 and the other input node of logic gate 711, connected to another input node of NAND gate 713, and further connected to one input node of logic gate (NOR gate) 714, all through inverter 708. NAND gate 713 provides an enable signal $\overline{EN7}$ for activating the "nibble mode". The output gate of logic gate 714 is connected to the input node of inverter 718. Inverter 718 provides an enable signal $\overline{EN8}$ for activating the "2 CAS mode". The output node of logic gate 715 is connected to the input node of inverter 719. Inverter 719 provides an enable signal $\overline{EN9}$ for activating the "2 WE mode".

It should be noted that enable signal $\overline{EN4}$ from selecting circuit 6 shown in FIG. 4 is applied to logic gates 710, 712 to 715 in selecting circuit 7.

Table 3 shows the correspondence between the connection/disconnection state of selection pads MS3, MS4 and the operation mode in the cases of the "x1 configuration", "x4 configuration" or "x8 configuration". Table 4 shows the correspondence between the connection/disconnection state of selection pads MS3, MS4 and the operation mode in the case of the "x16 configuration".

TABLE 3

In the cases of x1, x4 x8

| Operation mode | MS3 | MS4 |
| --- | --- | --- |
| Fast page | OPEN | OPEN |
| Static column | Vcc | OPEN |
| Nibble | OPEN | Vss |

TABLE 4

In the case of x16

| Operation mode | MS3 | MS4 |
| --- | --- | --- |
| Fast page | OPEN | — |
| Static column | Vcc | — |
| 2 CAS | — | OPEN |
| 2 WE | — | Vss |

When both selection pads MS3 and MS4 are in an open state, for example, the potential of selection pad MS3 is pulled down to the ground potential Vss by transistor 701, resulting in application of an L level to inverter 703. In response to this, a mode select signal MSI3 at an L level is applied to logic gates 709 and 710, respectively. A mode select signal $\overline{MSI3}$ at an H level is applied to logic gates 711 to 713, respectively.

The potential of selection pad MS4 is pulled down to the power supply potential Vcc by transistor 702, resulting in application of an H level to inverter 704. In response to this, a mode select signal MSI4 at an L level is applied to logic gates 709, 711, 713, 714, respectively. A mode select signal $\overline{MSI4}$ at an H level is applied to logic gate 715.

When the "x1 configuration", "x4 configuration" or "x8 configuration" is selected by selecting circuit 6 shown in FIG. 4 in an open state of selection pads MS3 and MS4, enable signal $\overline{EN4}$ at an H level is applied to logic gates 710, 712–715, respectively. Therefore, only enable signal $\overline{EN5}$ attains an L level, resulting in selection of the "fast page mode".

On the other hand, when the "x16 configuration" is selected by selecting circuit 6 in an open state of selection pads MS3 and MS4, enable signal $\overline{EN4}$ at an L level is applied to logic gates 710, 712–715, respectively. Therefore, only enable signals $\overline{EN5}$ and $\overline{EN8}$ attain an L level, resulting in selection of the "fast page mode" and the "2 CAS mode".

In addition, as shown in Table 3, when the "x1 configuration", "x4 configuration" or "x8 configuration" is selected, with selection pad MS3 supplied with the power supply potential Vcc and selection pad MS4 in an open state, the "static column mode" is selected. When selection pad MS3 is in an open state, and selection pad MS4 is supplied with the ground potential Vss, the "nibble mode" is selected.

On the other hand, as shown in Table 4, when selection pad MS3 is supplied with the power supply potential Vcc in the case of the "x16 configuration", the "static column mode" is selected irrespectively of the connection state of selection pad MS4. When selection pad MS4 is supplied with the ground potential Vss, the "2 WE mode" is selected irrespectively of the connection state of selection pad MS3.

These operation modes will be described briefly.

Figure 7:
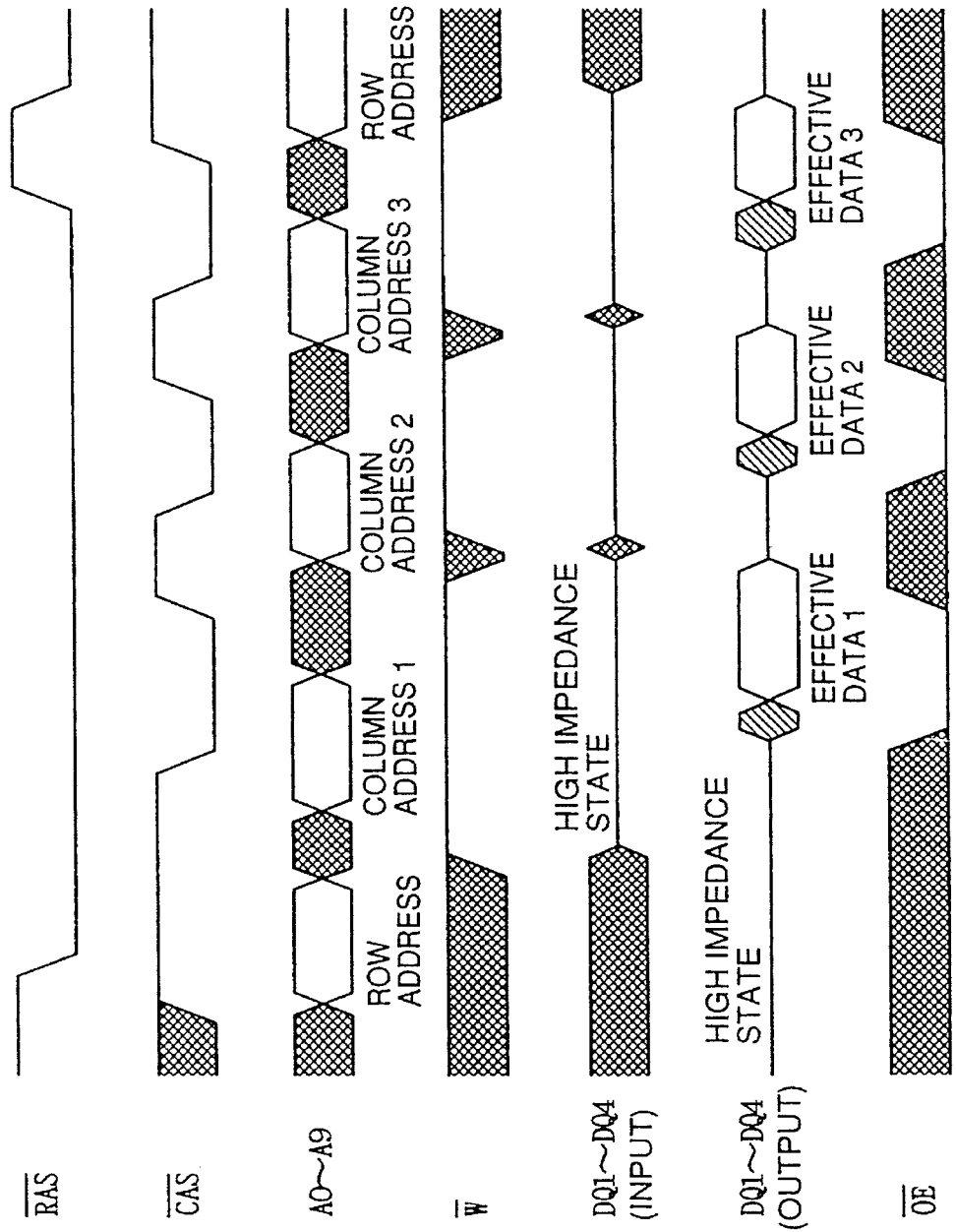
FIG. 7 is a timing chart showing operational waveforms of a fast page mode.

FIG. 7 is a timing chart showing operational waveforms of the "fast page mode". Referring to FIG. 7, in the "fast page mode", a row address is strobed in response to falling of row address strobe signal $\overline{RAS}$. While row address strobe signal $\overline{RAS}$ is maintained at an L level, column address strobe signal $\overline{CAS}$ is toggled a plurality of times. In response to falling of column address strobe signal $\overline{CAS}$, a plurality of column addresses are sequentially strobed. Therefore, a plurality of column addresses are accessed for one row address.

Figure 8:
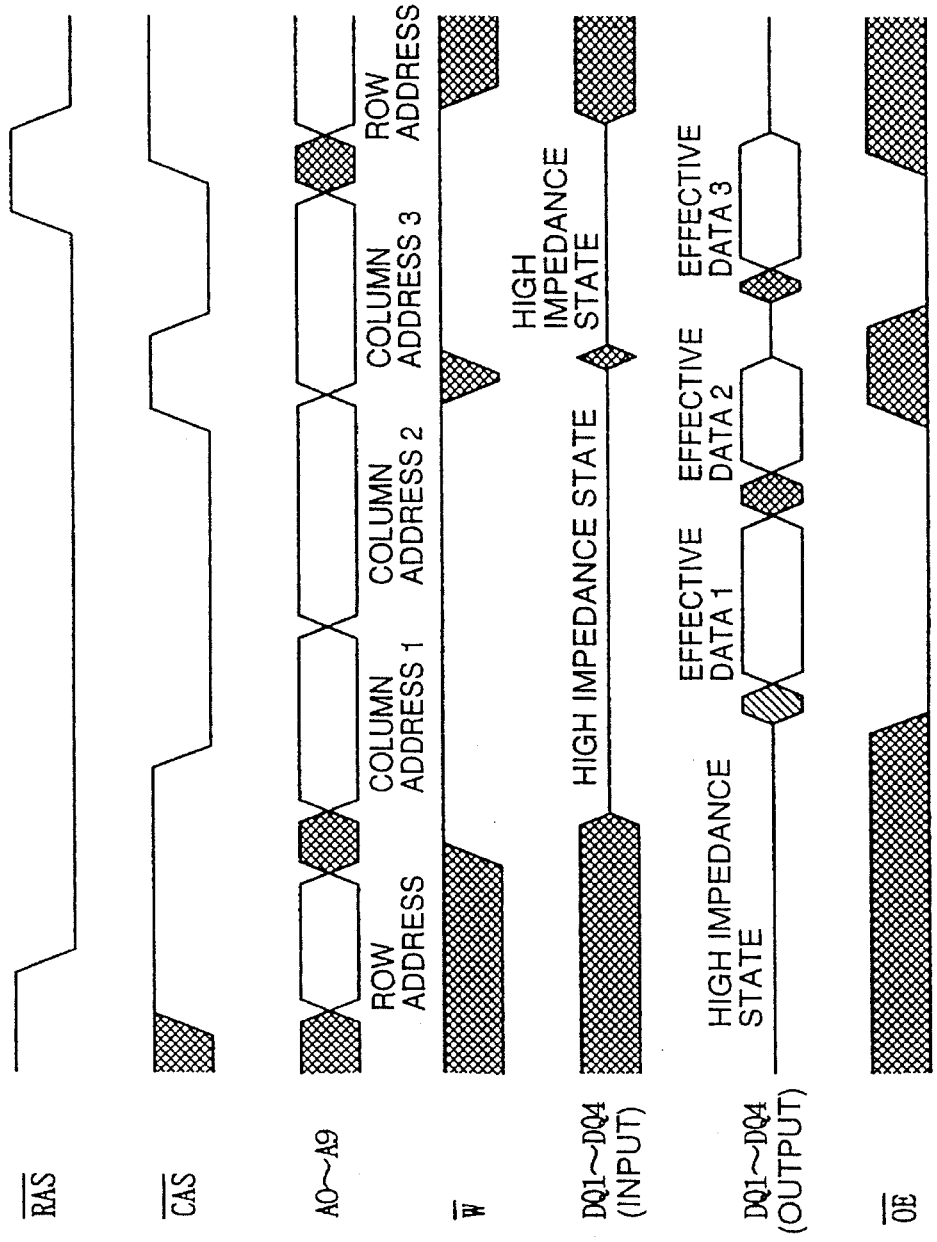
FIG. 8 is a timing chart showing operational waveforms of a static column mode.

FIG. 8 is a timing chart showing operational waveforms of the "static column mode". Referring to FIG. 8, in the "static column mode", a row address is strobed in response to falling of row address strobe signal $\overline{RAS}$. Then, a column address is strobed in response to falling of column address strobe signal $\overline{CAS}$. In addition, while row address strobe signal $\overline{RAS}$ and column address strobe signal $\overline{CAS}$ are maintained at an L level, the column address is changed, whereby a plurality of column addresses are accessed for one row address.

Figure 9:
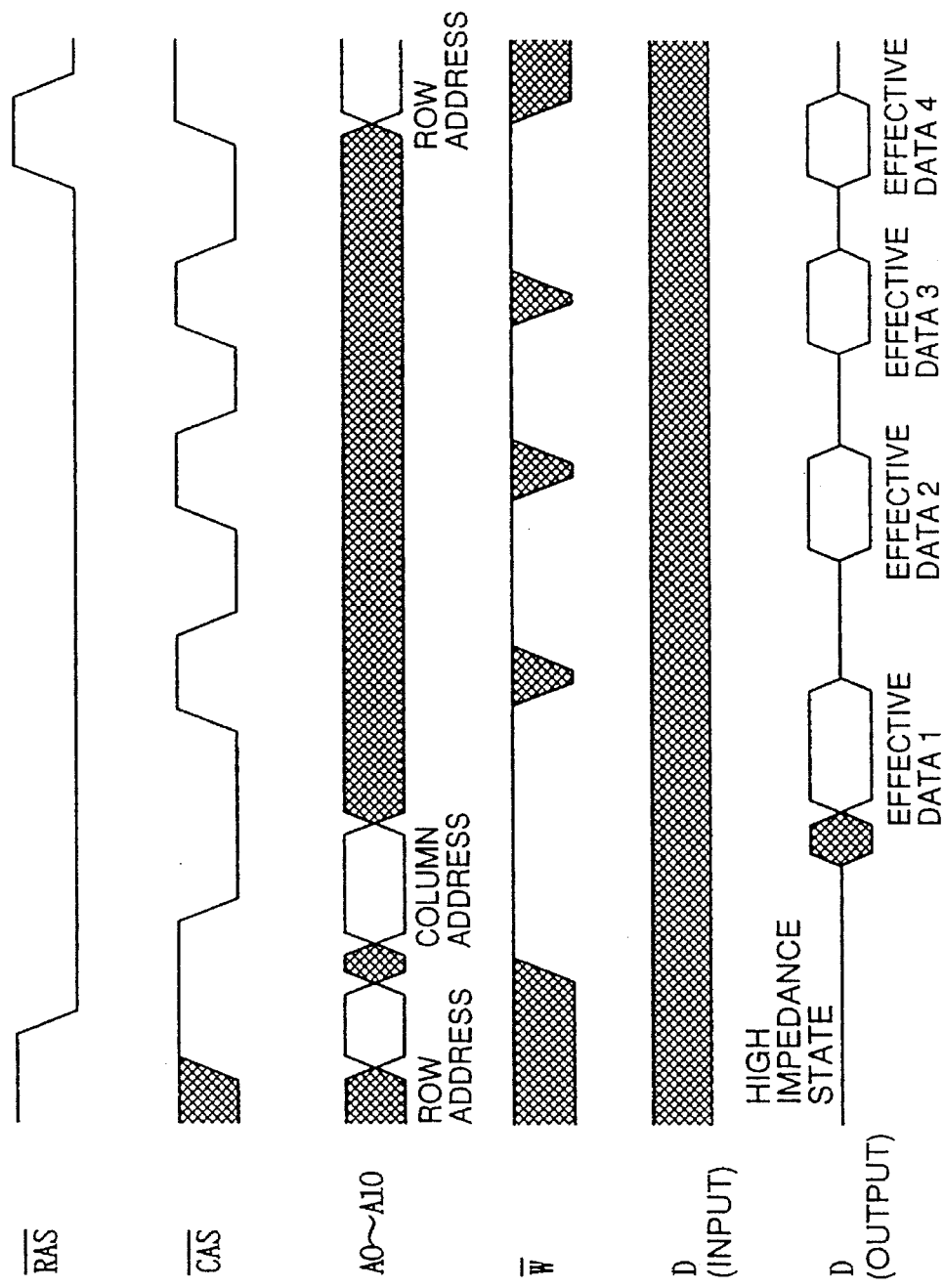
FIG. 9 is a timing chart showing operational waveforms of a nibble mode.

FIG. 9 is a timing chart showing operational waveforms of the "nibble mode". Referring to FIG. 9, in the "nibble mode", a row address is strobed in response to falling of row address strobe signal $\overline{RAS}$, and then a column address is strobed in response to falling of column address strobe signal $\overline{CAS}$. In addition, while row address strobe signal $\overline{RAS}$ is maintained at an "L level, column address strobe signal $\overline{CAS}$ is toggled three times. As a result, three column addresses which are continuous with the strobed column address are internally generated, resulting in access of four continuous column addresses for one row address.

Figure 10:
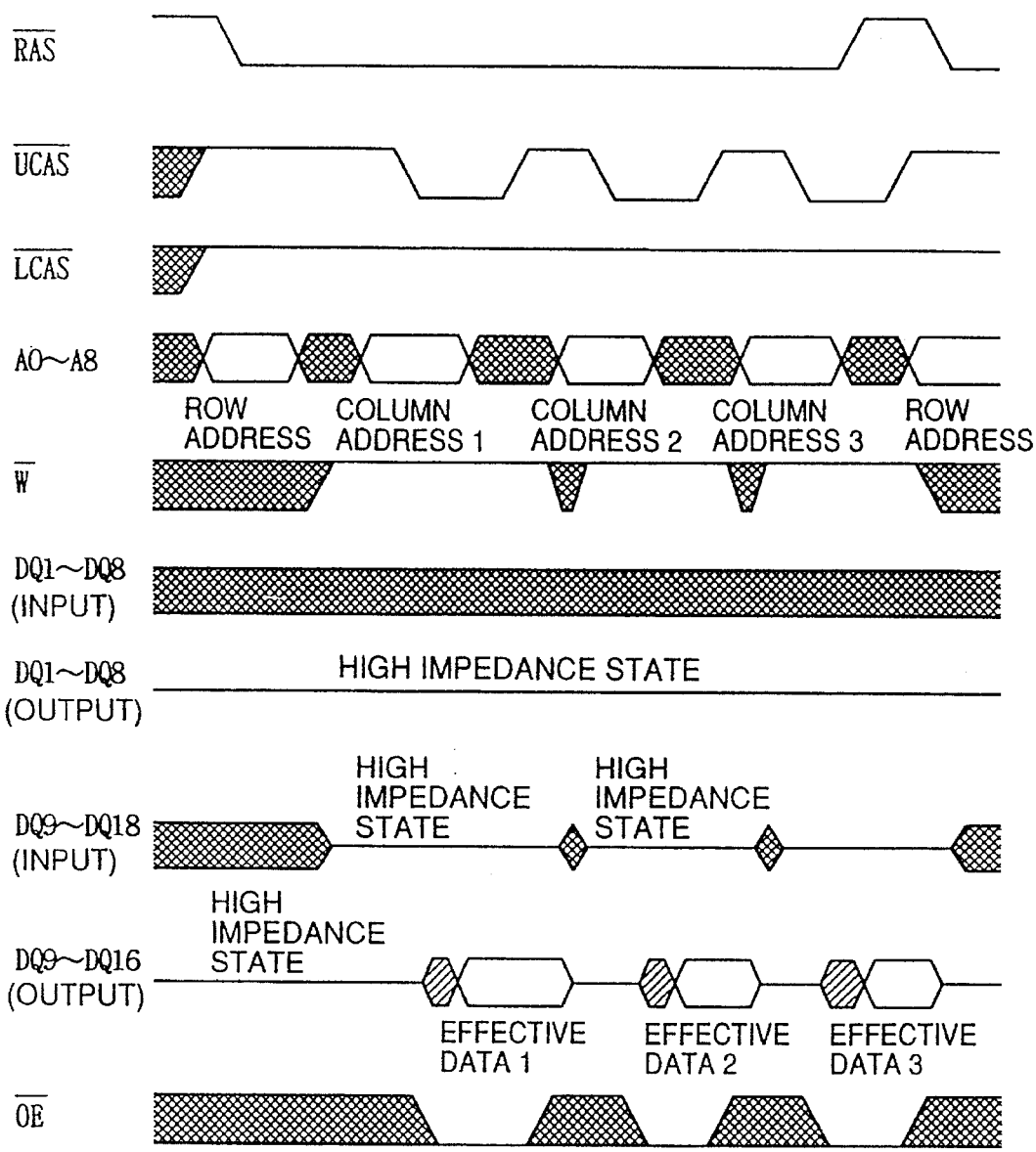
FIG. 10 is a timing chart showing operational waveforms of a 2 CAS mode.

FIG. 10 is a timing chart showing operational waveforms of the "2 CAS mode". Referring to FIG. 10, in the "2 CAS mode", two column address strobe signals $\overline{UCAS}$ and $\overline{LCAS}$ are supplied. In response to falling of the upper column address strobe signal $\overline{UCAS}$, a column address is strobed, whereby data DQ9 to DQ16 of the corresponding upper bits are provided. In response to falling of the lower column address strobe signal $\overline{LCAS}$, a column address is strobed, resulting in output of data DQ1 to DQ8 of the corresponding lower bits.

Figure 11:
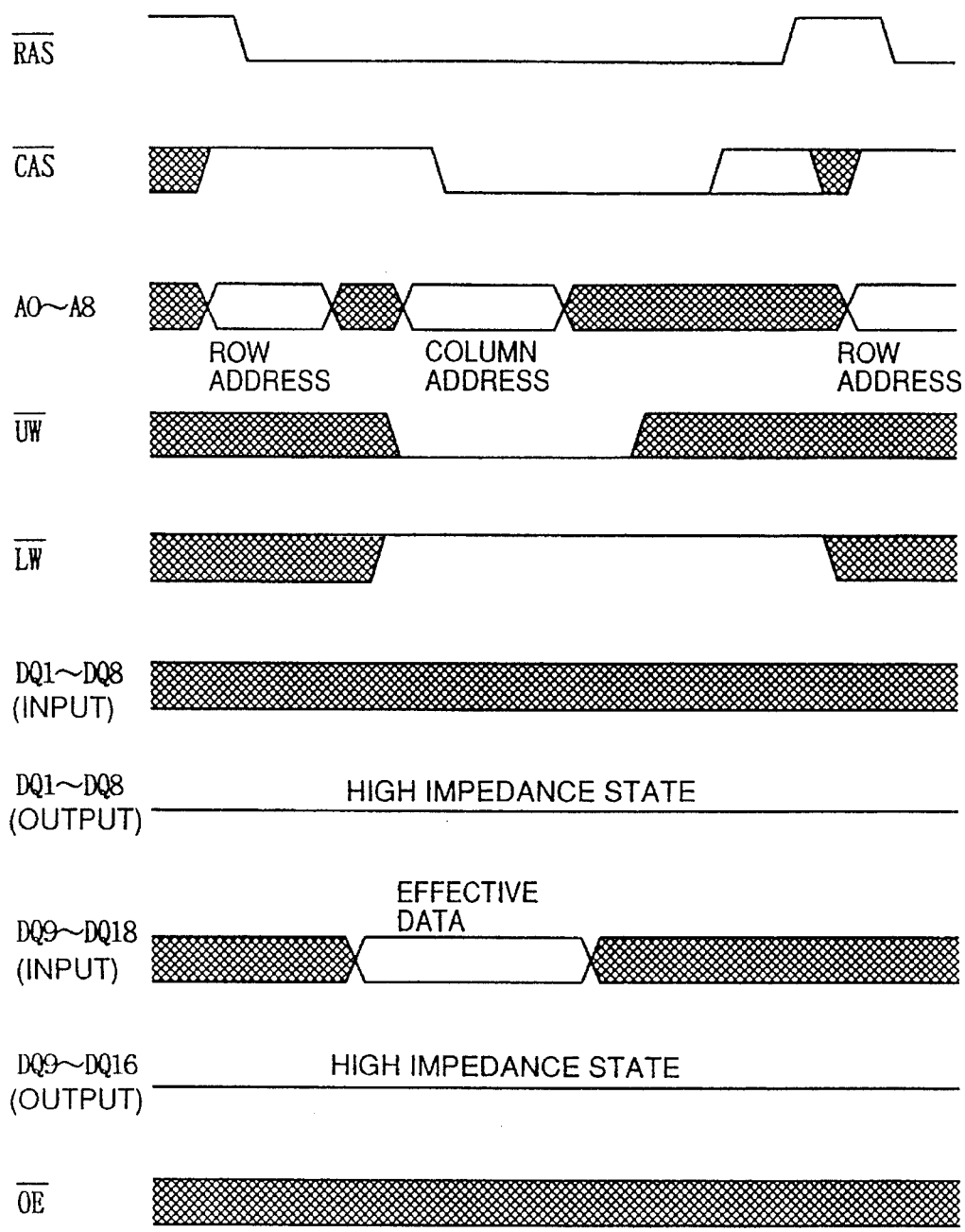
FIG. 11 is a timing chart showing operational waveforms of a 2 WE mode.

FIG. 11 is a timing chart showing operational waveforms of the "2 WE mode". Referring to FIG. 11, in the "2 WE mode", two write enable signals $\overline{UW}$ and $\overline{LW}$ are supplied. When the upper write enable signal $\overline{UW}$ attains an L level, data DQ9 to DQ16 of the corresponding upper bits are written in an accessed memory cell. When the lower write enable signal $\overline{LW}$ attains an L level, data DQ1 to DQ8 of the corresponding lower bits are written in the accessed memory cell.

As described above, in this embodiment, when the "x1 configuration", "x4 configuration" or "x8 configuration" is selected in an open state of both selection pads MS3 and MS4, the operation mode enters the "fast page mode". When the "x16 configuration" is selected, the operation mode enters the "fast page mode" in the "2 CAS mode".

Therefore, when production of a DRAM of the "fast page mode" is the largest in the "x1 configuration", "x4 configuration" or "x8 configuration", and when production of a DRAM of the "fast page mode" in the "2 CAS mode" is the largest in the "x16 configuration", it is not necessary to carry out bonding to selection pads MS3 and MS4 when a DRAM of large production is manufactured. Therefore, yield of such a DRAM of large production is increased, resulting in higher productivity of DRAMs in general.

If production of a DRAM of the "static column mode" is the largest in the "x1 configuration", "x4 configuration" or "x8 configuration", operation mode selecting circuit 7 shown FIG. 6 can be changed so that the "static column mode" is selected when selection pads MS3 and MS4 are both in an open state.

Embodiment 3

Figure 12:
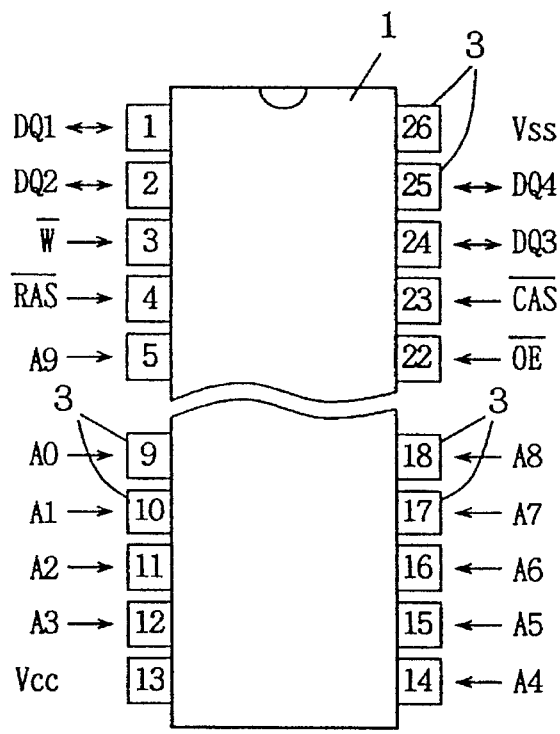
FIG. 12 is a diagram showing a pin arrangement of a normal bend type DRAM.
Figure 13:
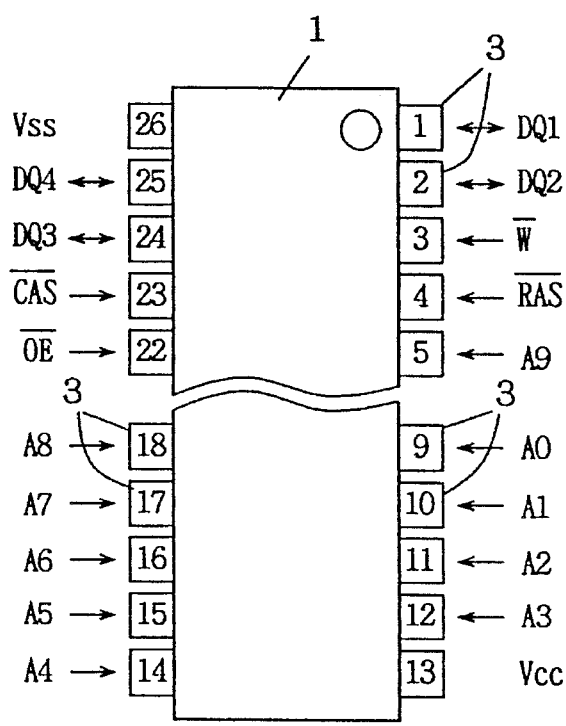
FIG. 13 is a diagram showing a pin arrangement of a reverse bend type DRAM corresponding to the normal bend type DRAM shown in FIG. 12.

FIGS. 12 and 13 show pin arrangements of a 4-mega bit DRAM. FIG. 12 shows a pin arrangement of a normal bend type DRAM, and FIG. 13 shows a pin arrangement of a reverse bend type DRAM.

As is clear from comparison of FIGS. 12 and 13, these pin arrangements are symmetrical with respect to each other. More specifically, the first pin to the twenty-sixth pin are disposed counterclockwise in a normal bend product of FIG. 12, while the first pin to the twenty-sixth pin are disposed clockwise in a reverse bend product of FIG. 13.

A pin to which the power supply potential Vcc is applied in the normal bend product and a pin to which the power supply potential Vcc is applied in the reverse bend product are positioned so as to oppose to each other, for example. Similarly, pins to which address signals A0 to A3 are applied in the normal bend product and pins to which address signals A0 to A3 are applied in the reverse bend product are positioned so as to oppose to each other, respectively.

Figure 14:
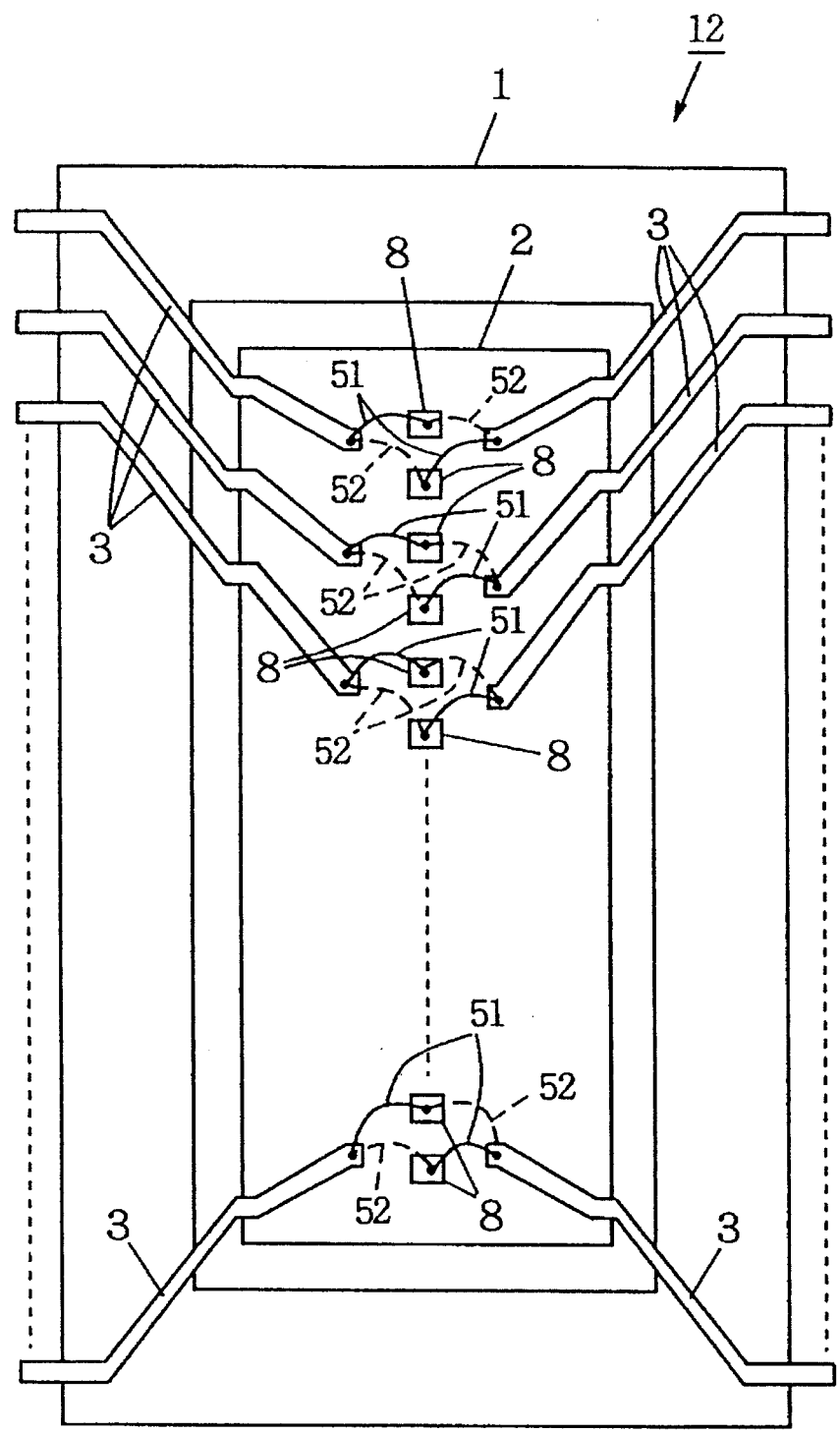
FIG. 14 is a plan view showing a configuration of a DRAM according to Embodiment 3 of the present invention.

FIG. 14 is a plan view showing the configuration of the DRAM according to Embodiment 3 of the present invention. Referring to FIG. 14, a DRAM 12 includes package 1 formed of resin or the like, semiconductor chip 2 housed in package 1, and a plurality of leads 3 disposed in parallel with two opposing sides of package 1. Each lead 3 is disposed from the outside of package 1 over the periphery of semiconductor chip 2. One end portion of each lead 3 extends over semiconductor chip 2. Therefore, DRAM 12 has an LOC structure. The other end portion of each lead 3 projects from package 1, and the projected portion configures an external pin.

A plurality of pads 8 are disposed in line on semiconductor chip 2 in parallel with two opposing sides of package 1. Two pads adjacent to each other out of the plurality of pads 8 are disposed corresponding to two opposing leads 3.

In the case of a normal bend product, as shown by a solid line in FIG. 14, one of two pads 8 adjacent to each other is connected to one corresponding lead 3 via a wire 51. The other pad is connected to the other corresponding lead 3 via wire 51.

On the other hand, in the case of a reverse bend product, one of two pads 8 adjacent to each other is connected to one corresponding lead 3 via a wire 52. The other pad is connected to the other corresponding lead 3 via wire 52.

Figure 18:
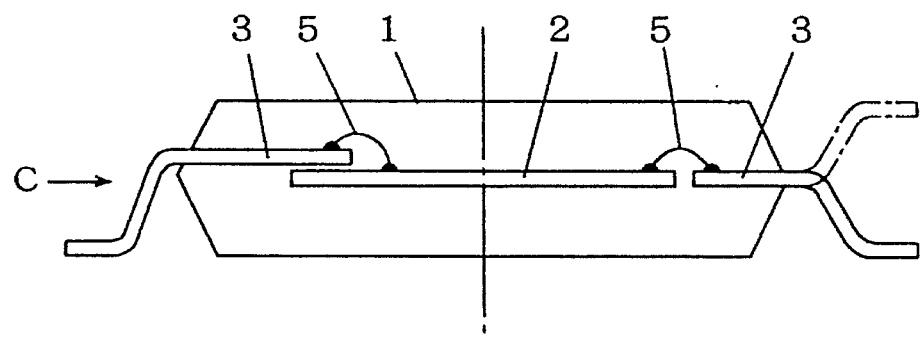
FIG. 18 is a side view showing the conventional DRAM, the right side of which shows a method of manufacturing normal and reverse bend type DRAMs.

Therefore, it is not necessary to bend lead 3 as shown in FIG. 18, whereby a normal bend product and a reverse bend product can be manufactured using one kind of lead 3.

Since two pads 8 selectively connected to two leads 3 opposing to each other are disposed adjacent to each other, wires 51, 52 connecting these pads 8 to leads 3 do not cross other wires. Therefore, wires do not come in contact with each other. A normal bend type DRAM and a reverse bend type DRAM can be manufactured at high yield.

In Embodiment 3, description was made using a DRAM of an LOC type. However, the present invention is neither limited to the LOC type, nor limited to the DRAM. Therefore, the present invention can be applied to every semiconductor integrated circuit device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:

a package;

a semiconductor chip housed in said package and selectively carrying out any of a plurality of first predetermined operations;

a plurality of leads each disposed from the outside of said package to a periphery of said semiconductor chip, said plurality of leads including a first power supply lead for receiving a power supply potential and a second power supply lead positioned apart from said first power supply lead for receiving a power supply potential;

a first power supply pad disposed on said semiconductor chip and connected to said first power supply lead;

a second power supply pad disposed on said semiconductor chip and connected to said second power supply lead;

a first selection pad disposed in the vicinity of said first power supply lead on said semiconductor chip and having one of a connection state to said first power supply lead and a disconnection state therefrom;

a second selection pad disposed in the vicinity of said second power supply lead on said semiconductor chip and having one of a connection state to said second power supply lead and a disconnection state therefrom; and first selecting means responsive to said connection/disconnection states of said first and second selection pads for selecting any of said plurality of first predetermined operations.

2. The semiconductor integrated circuit device as recited in claim 1, wherein said semiconductor chip further carries out selectively any of a plurality of second predetermined operations, said plurality of leads further include a third power supply lead for receiving a power supply potential and a fourth power supply lead positioned apart from said third power supply lead for receiving a power supply potential, and said device further comprises a third power supply pad disposed on said semiconductor chip and connected to said third power supply lead, a fourth power supply pad disposed on said semiconductor chip and connected to said fourth power supply lead, a third selection pad disposed in the vicinity of said third power supply lead on said semiconductor chip and having one of a connection state to said third power supply lead and a disconnection state therefrom, a fourth selection pad disposed in the vicinity of said fourth power supply lead on said semiconductor chip and having one of a connection state to said fourth power supply lead and a disconnection state therefrom, and second selecting means responsive to the operation selected by said first selecting means and to each connection/disconnection state of said third and fourth selection pads for selecting any of said plurality of second predetermined operations.

3. The semiconductor integrated circuit device as recited in claim 1, wherein each one end portion of said plurality of leads is disposed over said semiconductor chip.

4. The semiconductor integrated circuit device as recited in claim 1, wherein said semiconductor chip is a semiconductor memory device which allows reading/writing of data, the number of data simultaneously read/written is determined in the operation selected by said first selecting means.

5. The semiconductor integrated circuit device, comprising:

a package;

a semiconductor chip housed in said package and selectively carrying out any of a plurality of first predetermined operations and any of a plurality of second predetermined operations;

a plurality of leads each disposed from the outside of said package to a periphery of said semiconductor chip;

a plurality of first selection pads each disposed corresponding to any of said plurality of leads on said semiconductor chip and having one of a connection state to a corresponding lead and a disconnection state therefrom;

first selecting means responsive to the operation selected by said plurality of first selection pads for selecting any of said plurality of first predetermined operations;

a plurality of second selection pads, each disposed corresponding to any of said plurality of leads on said semiconductor chip and having one of a connection state to a corresponding lead and a disconnection state therefrom; and second selecting means responsive to the operation selected by said first selecting means and said connection/disconnection states of said plurality of second selection pads for selecting any of said plurality of second predetermined operations.

6. The semiconductor integrated circuit device as recited in claim 5, wherein each one end portion of said plurality of leads is disposed over said semiconductor chip.

7. The semiconductor integrated circuit device as recited in claim 5, wherein said semiconductor chip is a semiconductor memory device which allows reading/writing of data, the number of data simultaneously read/written is determined in the operation selected by said first selecting means.

8. A semiconductor integrated circuit device for use as a normal bend product and a reverse bend product, comprising:

a package;

a semiconductor chip housed in said package;

a plurality of leads disposed along two opposing sides of said package, one half of all leads disposed on one of said two opposing sides and another half of all leads disposed on another of said two opposing sides to form pairs of opposing leads, and each lead disposed from the outside of said package to a periphery of said semiconductor chip; and a plurality of pads corresponding in number to said plurality of leads disposed in parallel with said two opposing sides on said semiconductor chip, a pair of pads corresponding to a pair of opposing leads, said pair of pads being disposed adjacent to each other, wherein when the product is configured as a normal bend product, one of two pads corresponding to two leads opposing each other is connected to one of said two leads and the other of the two pads is connected to the other of said two leads, and when the product is configured as a reverse bend product, said one of two pads is connected to said other of said two leads, and said other of the two pads is connected to said one of said two leads.

9. The semiconductor integrated circuit device as recited in claim 8, wherein each one end portion of said plurality of leads is disposed over said semiconductor chip.

* * * * *